United States Patent [19]

Pladek

[11] Patent Number: 5,751,824
[45] Date of Patent: May 12, 1998

[54] METHOD OF STABILIZING THE LEVEL OF AN AUDIO SIGNAL IN TELEVISION BROADCASTING

[75] Inventor: Robert B. Pladek, Middletown, N.J.

[73] Assignee: Lucent Technologies Inc., Murray Hill, N.J.

[21] Appl. No.: 311,648

[22] Filed: Sep. 23, 1994

[51] Int. Cl.⁶ .................................................. H03G 3/00
[52] U.S. Cl. .................................. 381/104; 381/106
[58] Field of Search ............................ 381/106, 107, 381/13–14, 102, 104, 119; 333/14; 348/678

[56] References Cited

U.S. PATENT DOCUMENTS

| | | | |
|---|---|---|---|
| 4,314,372 | 2/1982 | Bakgaard | 455/68 |
| 4,500,921 | 2/1985 | Tomizawa | 348/678 |
| 4,704,727 | 11/1987 | Beard | 381/106 |
| 5,130,665 | 7/1992 | Walden | 381/104 |
| 5,155,769 | 10/1992 | Werrbach | 381/14 |
| 5,349,386 | 9/1994 | Borchardt et al. | 381/14 |
| 5,543,849 | 8/1996 | Long | 348/360 |
| 5,561,715 | 10/1996 | Long | 381/14 |
| 5,615,256 | 3/1997 | Yamashita | 381/104 |

FOREIGN PATENT DOCUMENTS

| | | | |
|---|---|---|---|
| 2207279 | 1/1989 | United Kingdom | G11B 27/30 |
| 2244184 | 11/1991 | United Kingdom | H04B 1/12 |

*Primary Examiner*—Curtis Kuntz
*Assistant Examiner*—Xu Mei
*Attorney, Agent, or Firm*—Frederick B. Luludis

[57] ABSTRACT

To prevent particular transmission equipment from artificially increasing low level audio signals to a predetermined allowable level, such signals are first summed with a stabilization signal having a predetermined frequency to form a composite audio signal. Moreover, the stabilization signal has a level that prevents any increase in signal level that may be artificially imposed on the composite signal during the processing of the composite signal by the transmission equipment. Once the composite signal has been so processed, then the stabilization signal is removed therefrom and the original audio signal is outputted to associated transmission media.

8 Claims, 2 Drawing Sheets

METHOD OF STABILIZING THE LEVEL OF AN AUDIO SIGNAL IN TELEVISION BROADCASTING

TECHNICAL FIELD

The invention relates to the transmission of audio signals.

BACKGROUND OF THE INVENTION

The AGC circuit and/or limiter circuit in the transmitter section of a TV broadcasting system artificially raises low levels of audio signals of a broadcast commercial to an allowable maximum level and then transmits the resulting signals over associated transmission media, e.g., antenna, coax cable, fiber, etc. The effect of artificially raising the level of such audio signals may create a result not intended by the producer of the commercial. For example, assume that a television commercial as produced purposely starts with a low-level audio signal, e.g., $-20$ VU audio signal, then slowly increases the volume of the audio signal over a predetermined period of time, e.g., 10 seconds. However, when the commercial is processed by particular broadcast television equipment for transmission over associated transmission media, the AGC and/or limiter circuits in such equipment artificially increases the $-20$ VU (low-level) audio signal portion of the commercial to, for example, $-5$ to $0$ VU, thereby diminishing the desired effect intended by the producer of the commercial.

SUMMARY OF THE INVENTION

The relevant art is advanced, in accord with an aspect of the invention, by controlling an audio signal in such a way that the desired effect intended by the producer of the commercial is not diminished. More specifically, such an audio signal is first summed with a stabilization signal having a predetermined frequency to form a composite audio signal in which the stabilization signal has a level that prevents any increase signal level that may be artificially imposed on the composite signal by transmission equipment processing the composited signal. Once the composite signal has been so processed, then the stabilization signal is removed therefrom and the original audio signal is outputted to associated transmission media.

DETAILED DESCRIPTION

Figure 1:
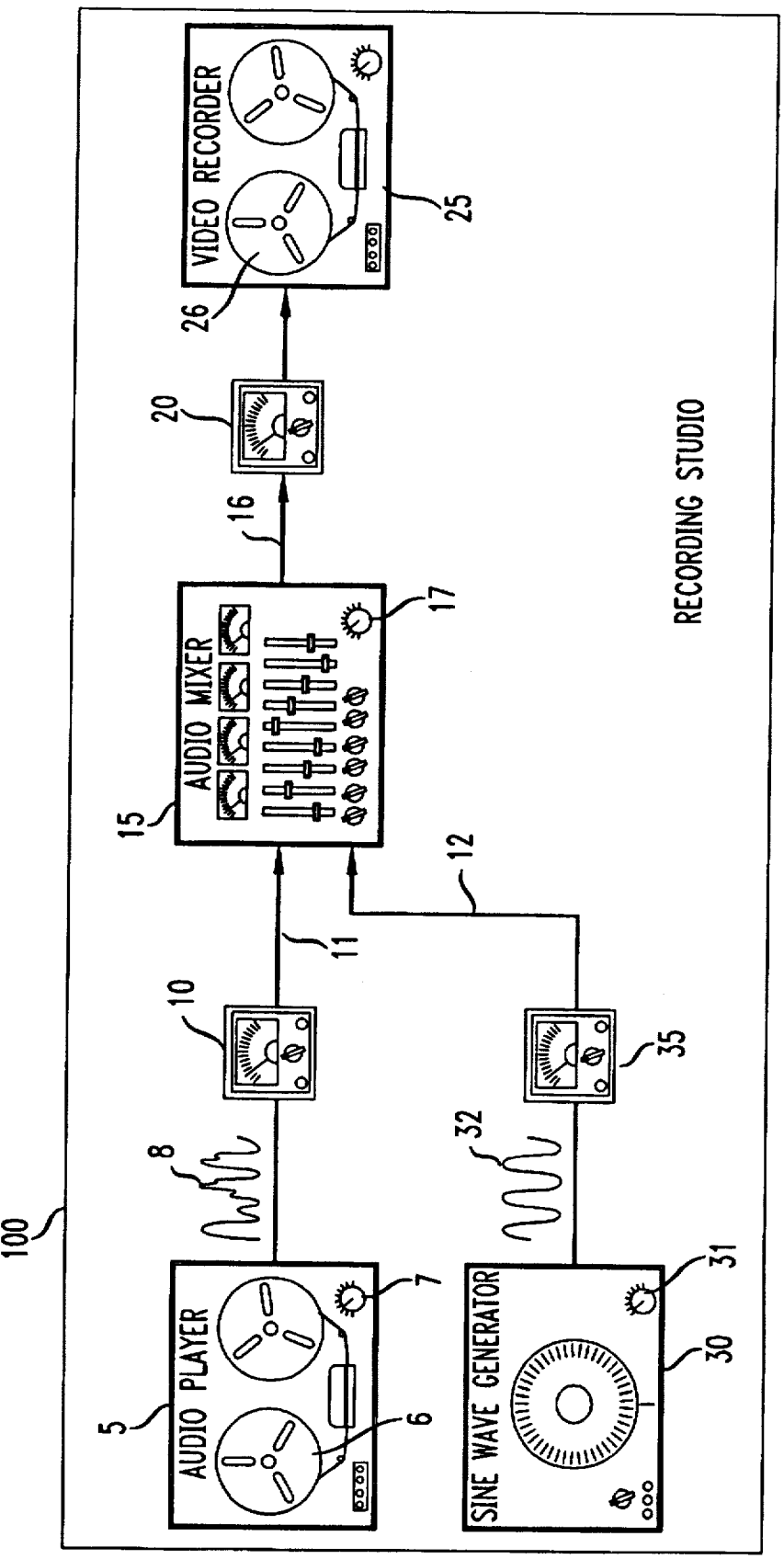
FIG. 1 is a broad block diagram of commercial recording studio in which a principal aspect of the invention may be practiced.

It is noted that although the following discusses the claimed invention in the context of television broadcasting, that should not be construed as being a limitation of the claimed invention, since it is apparent that the invention may be practiced in any application where there is need to control the level of an audio signal that will be processed by AGC or limiter circuits. (It is noted that the terms AGC and limiter circuits as used herein include any type of circuit and/or device which increases the level of a signal to a level prescribed by a predetermined requirement, e.g., a transmission requirement.) Moreover, the following discussion uses the term "stabilization signal" which is defined herein as being a signal that remains at a constant level, for example, a level of 0 VU, in which the frequency of the stablization signal is selected for a given application. In certain applications, the constant level will be an allowable level set by the respective application.

With that in mind, the following first discusses the way in which the stabilization signal is generated and added to a commercial broadcast soundtrack and then discusses the processing of the resulting signal at a broadcast facility. Specifically, recording studio 100 shown in FIG. 1 includes audio playback device 5 for reproducing in a conventional manner the original sound track of a commercial broadcast that is recorded on storage media 6, e.g., magnetic tape. Audio playback device 5 includes control 7 for adjusting the level of the audio signal that device 5 outputs to VU meter 10. The level of the audio signal that device 5 outputs is thus monitored by VU meter 10 to ensure that the level does not exceed, for example, 0 VU. The output of VU meter 10 is then presented to input 11 of audio device 15, which may be, for example, a conventional audio mixer.

In accord with an aspect of the invention, a stabilization signal is combined with the audio signal in a conventional manner to prevent the level of the latter signal from being artificially increased when it is being processed by particular broadcasting equipment. Specifically, stabilization signal 32 is generated by a conventional sine wave generator 30 which includes volume control 31 for adjusting the level of stabilization signal 32. In accord with an aspect of the invention, the level of the stabilization is monitored by VU device 35 and adjusted using volume control 31 to ensure that the level of the stabilization signal does not exceed a predetermined transmission level, e.g., a level of 0 VU. (For the purpose of the present application and not by way of limitation, as noted above, the frequency of stabilization signal 32 in accord with the present illustrative application of the invention is set to, for example, 18 kHz. The reason for selecting that frequency will become apparent below.)

Continuing, VU device 35 then presents the stabilization signal to input 12 of audio device 15. Audio device 15, in a conventional manner, sums the input signals appearing at inputs 11 and 12 to produce a single, output signal (i.e., a composite signal), which is presented to path 16. Similarly, audio device 15 includes volume control 17 for ensuring that the level of the "mixed" audio signal that is outputted to path 16 does not exceed 0 VU as monitored by VU device 20. The mixed audio signal is then presented to recording device 25 where it is recorded onto storage media 26, which may be, for example, video tape. In an illustrative embodiment of the invention, device 25 may be, for example, a so-called D2 digital video tape recorder. The recording produced by device 25 may then be presented to a television broadcast facility, e.g., a television station, for commercial broadcast.

Figure 2:
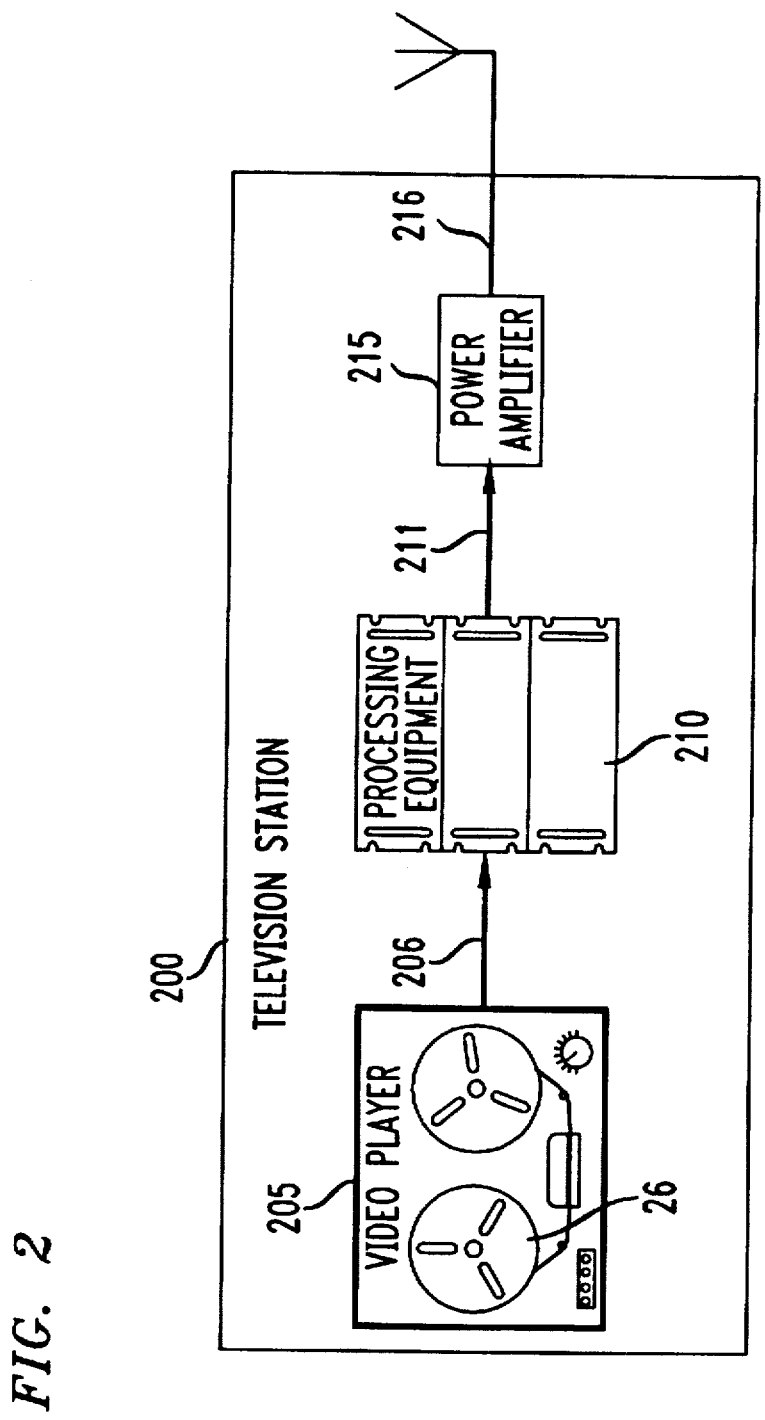
FIG. 2 is a broad block diagram of commercial broadcast facility in which the principles of the invention may be practiced.

A broad block diagram of such a facility is shown in FIG. 2 and includes, inter alia, playback device 205 which outputs to path 206 for presentation to audio/video processing equipment 210 the information that has been prerecorded on storage media 26. Processing equipment 210 includes conventional television broadcasting equipment such as AGC and limiter circuits, amplifiers, audio compressors, signal modulators, signal combiners, etc. Such equipment processes the signal that is received via path 206 such that the AGC circuit of equipment 210 is stabilized (controlled) by the stabilization signal to prevent the AGC circuit (not shown) from raising the level of the original audio signal stored on storage media 6 (FIG. 1) and which forms part of the composite signal recorded on media 26.

Equipment 210, more particularly, processes the signal that it receives via path 206 in accord with a plurality of well-known transmission requirements. One such requirement, in this case broadcast television, band-limits the audio signal that is outputted to path 211 to a frequency range of 50 Hz to 15 kHz. Since the frequency of the stabilization signal is not within the required band-limited audio range, it is removed (filtered out) by equipment 210 leaving, in accord with the aspect of the invention, an audio signal that is virtually identical to the original audio signal 8 (FIG. 1). Thus, in accord with an aspect of the invention, stabilization signal 32 prevents equipment 210 from artificially increasing the commercial audio signal.

Following the processing of the commercial broadcast signals that it receives via path 206, equipment 210 outputs a processed version of signal 8 to path 211 for presentation to conventional transmitter equipment 215. Equipment 215, in turn, presents the commercial broadcast signal to an associated transmission media, e.g., a transmitting antenna for over-the-air transmission. (It is noted that for the sake of clarity and conciseness, the processing of video signals has been omitted from the Figs. and the foregoing).

The foregoing is merely illustrative of the principles of the invention. Those skilled in the art will be able to devise numerous arrangements, which, although not explicitly shown or described herein, nevertheless embody those principles that are within the spirit and scope of the invention. For example, although the invention has been discussed in the context of commercial broadcast television, it may also be practiced in any application where there is need to control the level of an audio signal that will be processed by AGC or limiter circuits, as mentioned above. For example, such a need may be found in such applications as commercial radio, (AM and/or FM), cellular and/or wired telephone transmission, film industry, satellite, fiber optic transmission, infrared as well as high-definition television.

I claim:

1. A method of controlling the level of an audio signal such that said level remains unchanged after being processed by particular transmission equipment which increases the level of an audio signal when the level is below a predetermined maximum allowable level, said method comprising the steps of summing the audio signal with a stabilization signal having a predetermined frequency to form a composite audio signal, said stabilization signal having a level corresponding to said allowable level, supplying the composite audio signal to said transmission equipment for processing such that said transmission equipment operates only on said stabilization signal as a result of said stabilization signal having said corresponding allowable level, and then forwards the processed signal to a band-limiting function to remove the stabilization signal from the composite audio signal, and outputting the audio signal for reception by particular receiving equipment.

2. The method of claim 1 further comprising the step of setting the level of said stabilization signal to said allowable level as said stabilization signal is being generated.

3. The method of claim 1 wherein said transmission equipment is broadcast television equipment.

4. A method of controlling the level of an audio signal such that said level remains unchanged after being processed by particular transmission equipment which increases the level of an audio signal when the level is below a predetermined maximum allowable level said method comprising the steps of summing the audio signal with a stabilization signal having a predetermined frequency to form a composite audio signal, said stabilization signal having a level corresponding to said allowable level, supplying the composite audio signal to said transmission equipment for processing such that said transmission equipment operates only on said stabilization signal as a result of said stabilization signal having said corresponding allowable level, and then forwards the processed signal to a band-limiting function to remove the stabilization signal from the composite audio signal, and outputting the audio signal for reception by particular receiving equipment, and wherein said frequency is 18 kHz.

5. A method of controlling the level of an audio signal such that said level remains unchanged after being processed by particular transmission equipment which increases the level of an audio signal when the level is below a predetermined maximum allowable level said method comprising the steps of summing the audio signal with a stabilization signal having a predetermined frequency to form a composite audio signal, said stabilization signal having a level corresponding to said allowable level, supplying the composite audio signal to said transmission equipment for processing such that said transmission equipment operates only on said stabilization signal as a result of said stabilization signal having said corresponding allowable level, and then forwards the processed signal to a band-limiting function to remove the stabilization signal from the composite audio signal, and outputting the audio signal for reception by particular receiving equipment, and wherein said allowable level is 0 VU.

6. A method of processing a composite audio signal for transmission over associated transmission media, said composite audio signal being formed from an audio signal component and a stabilization signal component of a predetermined allowable level, said method comprising the steps of supplying the composite audio signal to predetermined signal processing equipment which processes audio signals such that the levels of the audio signals are increased to meet but not exceed said predetermined allowable signal level, responsive to receiving the composite audio signal, processing the composite audio signal without changing the level of that signal as a result of the level of the stabilization signal component of said composite signal corresponding to said predetermined allowable level, and deleting the stabilization signal component from said composite signal after said composite signal has been processed by said processing equipment and then transmitting the remaining audio signal component over said transmission media to receiving equipment.

7. The method of claim 6 further comprising the step of generating said stabilization signal so that it is of a predetermined frequency.

8. The method of claim 7 wherein said step of deleting includes the step of band-limiting said composite signal to delete said stabilization signal component from said composite signal as a result of the frequency of said stabilization signal component being out of a range of frequencies forming said band.

* * * * *